United States Patent
Blayac et al.

(10) Patent No.: US 6,495,869 B2
(45) Date of Patent: Dec. 17, 2002

(54) METHOD OF MANUFACTURING A DOUBLE-HETEROJUNCTION BIPOLAR TRANSISTOR ON III-V MATERIAL

(75) Inventors: Sylvain Blayac, Fontenay-aux-Roses (FR); Muriel Riet, Epinay Orge (FR); Philippe Berdaguer, Savigny Orge (FR)

(73) Assignee: Alcatel, Paris (FR)

( * ) Notice: Subject to any disclaimer, the term of this patent is extended or adjusted under 35 U.S.C. 154(b) by 35 days.

(21) Appl. No.: 09/781,275

(22) Filed: Feb. 13, 2001

(65) Prior Publication Data
US 2001/0015474 A1 Aug. 23, 2001

(30) Foreign Application Priority Data
Feb. 14, 2000 (FR) ............................................. 00 01804

(51) Int. Cl.⁷ ............................................. H01L 29/737
(52) U.S. Cl. ..................... 257/197; 257/586; 257/587; 257/745; 257/773; 438/689
(58) Field of Search ................. 257/197, 198, 257/586, 587, 744, 745, 773

(56) References Cited

U.S. PATENT DOCUMENTS

| 4,967,252 A | * | 10/1990 | Awano ........................ 257/197 |
| 5,084,750 A |   | 1/1992  | Adlerstein |
| 5,262,353 A |   | 11/1993 | Sun et al. |
| 5,268,315 A |   | 12/1993 | Prasad et al. |
| 5,411,632 A |   | 5/1995  | Delage et al. |
| 5,446,294 A |   | 8/1995  | Bayraktaroglu |
| 5,455,440 A | * | 10/1995 | Henderson et al. ......... 257/197 |
| 5,525,818 A | * | 6/1996  | Hill ............................ 257/197 |
| 5,625,206 A | * | 4/1997  | Chandrasekhar et al. ... 257/197 |
| 5,703,895 A |   | 12/1997 | Ghirardi et al. |
| 6,310,368 B1 | * | 10/2001 | Yagura ........................ 257/197 |

FOREIGN PATENT DOCUMENTS

FR 2 726 125 A 4/1996

* cited by examiner

*Primary Examiner*—Gene M. Munson
(74) *Attorney, Agent, or Firm*—Sughrue Mion, PLLC

(57) ABSTRACT

The invention relates to a method of manufacturing a double heterojunction bipolar transistor (1) comprising successively at least one sub-collector layer, a collector layer, a base layer and a metallic layer (10) deposited on the said base layer; the said metallic layer (10) being extended towards a contact pad (110) of the base by an underetched metallic "air bridge" (100), characterized in that producing the said "air bridge" (100) includes the following steps:

effecting a first localized etching under the said bridge, this first etching being selective so as to etch the sub-collector layer laterally; and effecting a second localized etching under the said bridge, this second etching being selective so as to vertically etch at least the collector layer.

13 Claims, 3 Drawing Sheets

Section AA'

Section DD'

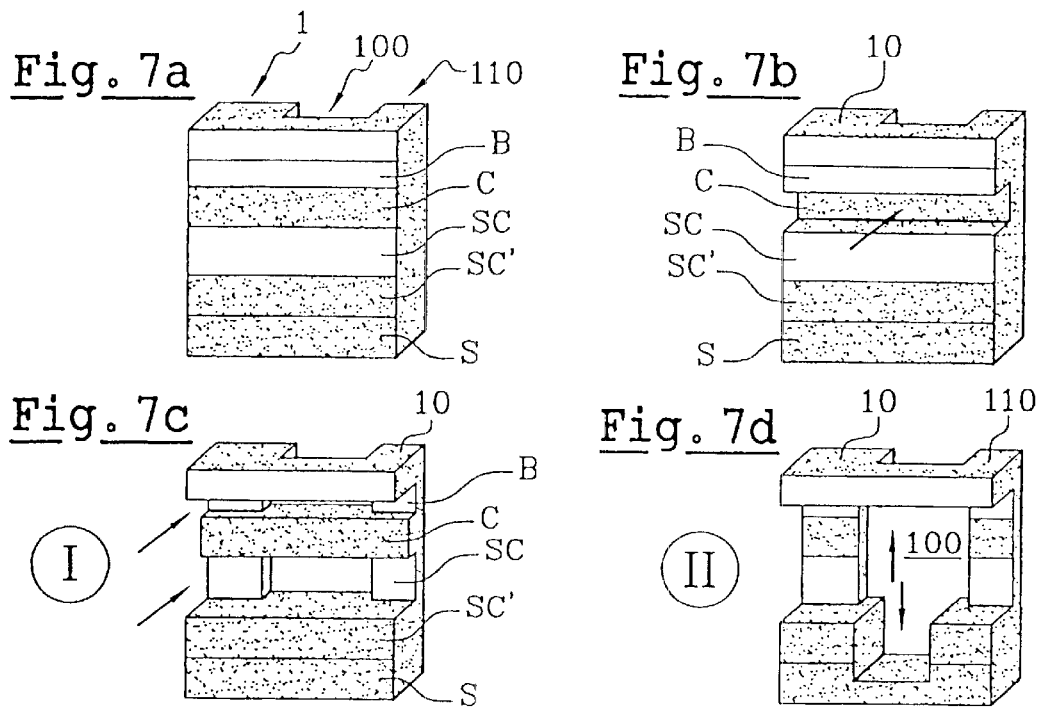
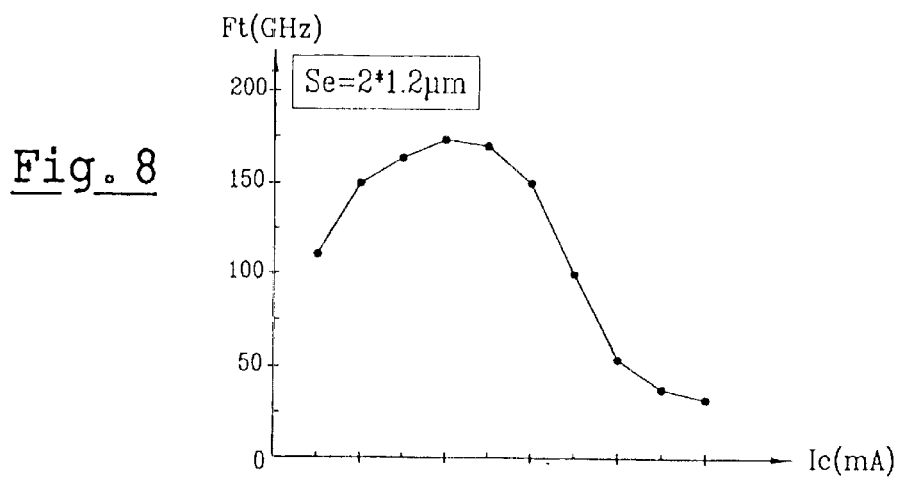
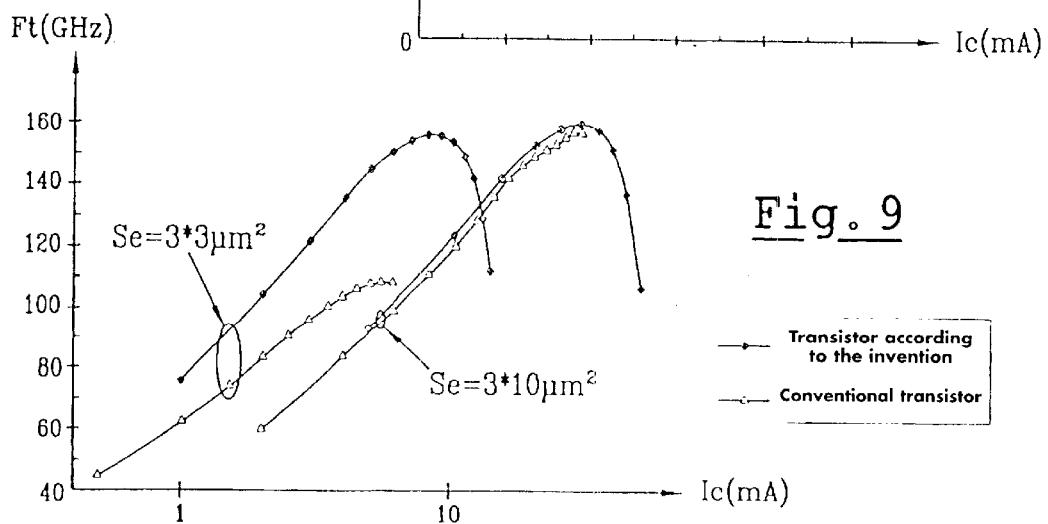

United States Patent

US 6,495,869 B2

METHOD OF MANUFACTURING A DOUBLE-HETEROJUNCTION BIPOLAR TRANSISTOR ON III-V MATERIAL

BACKGROUND OF THE INVENTION

The invention relates to the field of electronic and opto-electronic components produced on III-V material and intended to be used in the context of applications involving high data transfer rate on optical fibres.

The invention more specifically relates to the field of heterojunction bipolar transistors produced on III-V material. The object of the invention is to propose a method of manufacturing heterojunction bipolar transistors intended for manufacturing circuits for transmitting and receiving data on optical fibres, for example, or in any other high-throughput application. In order to follow changes in technology, such transistors need to be faster and faster and more and more compact.

A heterojunction bipolar transistor on III-V material is illustrated in FIG. 1. Such a transistor 1 is perfectly mastered in the state of the art. It consists of several epitaxial layers on an III-V substrate S, in the present case InP, the different layers being etched in order to form mesas which define the collector C, the base B and the emitter E of the transistor 1. Electrical contacts must be made on each of the mesas by depositing metallic regions 10, 20, 30.

A heterojunction is situated between the base and the emitter. The semiconductor layers constituting the base and the emitter are produced from different materials, the first from InGaAs and the second from InP, each doped with a different type. The heterojunction allows very high dopings of the base and makes it possible to produce a very fine base B. Thus very high operating frequencies are obtained.

According to the application, the transistor 1 can be of the simple heterojunction type (SHBT) with a homojunction between the base B and the collector C; or of the double heterojunction type (DHBT), the second heterojunction being situated between the base B and the collector C.

In order to obtain faster transistors, it is first of all necessary to decrease the size of the transistor and to reduce the parasitic surfaces extrinsic to the transistors.

In order to reduce the interconnection capacitances of the transistors, it is necessary to move them closer to each other. However, a minimum distance between two components is required in order to limit heating phenomena. In order to reduce this distance, it is therefore necessary to limit the heat dissipation of the transistors. In the case of a bipolar transistor, this heat dissipation is directly related to the surface area of the emitter. Reducing the extrinsic parasitics therefore requires decreasing the sizes of the transistors.

It should also be stated that the performance of a transistor is measured in particular at its operating frequency and depends on several parameters, including the base-collector capacitance $C_{BC}$. It is therefore necessary to reduce this capacitance $C_{BC}$ to the maximum possible extent in order to guarantee a better operating frequency, and consequently increased speed.

A first solution consists in reducing the base-collector capacitance by selective etching. This solution is presented in the publication "Reduction of Base-Collector Capacitance by undercutting the Collector and Subcollector in GaInAs/InP DHBT's" by Y. Miyamoto, J. M. M. Rios, A. G. Dentai and S. Chandrasekar (AT&T Bell Laboratories), which appeared on Mar. 3, 1996 in IEEE Electron Device Letters, Vol. 17, N°3.

Such a solution is illustrated in FIGS. 2a to 2c and consists essentially in partially underetching the collector layer C.

This solution has been implemented for a double heterojunction transistor (DHBT). The base layer B is composed of GaInAs and the collector layer C of InP. The latter is deposited on at least one sub-collector layer SC of GaInAs on which the contact 20 is made. The heterojunction between the base B and the collector C makes it possible to effect a selective underetching of the collector C with respect to the base B. It is therefore possible to reduce the surface area of the collector C whilst completely preserving the base B.

The capacitance $C_{BC}$ depends essentially on the thickness of the collector layer C and the common surface between the base B and collector C layers.

In order to reduce the capacitance $C_{BC}$, this publication proposes to reduce the common base-collector surface. To this end, the collector layer C made of InP is etched selectively between the base B and sub-collector SC layers.

It should be noted that this lateral etching of the InP collector C is possible only along certain crystallographic orientations, this same etching being completely blocked along unfavourable crystallographic axes. This solution is consequently applicable only if the transistor is oriented along one of the axes [001] or [010] on an InP wafer cut in the plane {100}.

This lateral etching makes it possible to reduce the base-collector common surface, as illustrated in FIG. 2b.

Nevertheless, when the longitudinal section of FIG. 2c is considered, it can be seen that the base-collector common surface is still large because of the surface 15 necessary for the contact 10 on the base B.

This surface area 15 is negligible for large transistors, but becomes a nuisance in the case of a small transistor, where it may represent up to 60% of the size of the transistor.

Thus the main problem related to the reduction of the size of the transistors stems from the proportional increase in the parasitic semiconductor surfaces intended for the contacts 10, 20, 30, and more specifically for the contact on the base 10. In particular, these surfaces are of a few $\mu m^2$. For a transistor 20 $\mu m$ long, these surfaces are negligible, whereas for a transistor 2 to 3 $\mu m$ long, these same surfaces become proportionally large and cause a degradation in the performance of the transistor.

The proportional decrease in these parasitic surfaces imposes severe technological constraints which are difficult to reconcile with the manufacturing yields imposed by the production of circuits containing several hundreds of transistors.

In order to resolve this problem of parasitic surface related to the contact on the base, the company NTT proposes a solution which consists of transferring this contact area outside the transistor itself by means of a metallic "air bridge".

This solution, illustrated in FIG. 3, is disclosed in the publication "High performance small InP/InGaAs HBTs with reduced parasitic base-collector capacitance fabricated using a novel base-metal design" by Minoru Ida, Shoji Yamahata, Hiroki Nakajima, Niriyuki Watanabe (NTT Photonics laboratories) In Proc of ISCS, Berlin Aug. 22–26, 1999.

This solution has been used on a simple heterojunction transistor (SHBT), the base B and the collector C both being composed of InGaAs doped differently. A metallic bridge 105 extends the contact metal 10 of the base B towards pads 115 to allow the production of a small transistor 1 without the parasitic surface related to the contact area 10 on the base B.

The metallic air bridge 105 is oriented along the crystallographic direction [010] whilst the transistor is oriented along the direction [01-1]. This particular implantation makes it possible to obtain a speed of etching of the collector C and base B layers under the bridge 105 which are higher than on the edges of the transistor 1.

This solution requires a particular implantation of the transistor, bridge and pads which complies with the crystallographic constraints.

In addition, since the etching of the bridge 105 and the etching of the transistor 1 are carried out simultaneously, this entails a very narrow bridge width.

In addition, the contact pads 115 on the base B must be connected so as to afford a correct electrical connection.

In addition, this solution being applied to simple heterojunction bipolar transistors SHBT, the collector C cannot be underetched laterally as described previously since it is of the same nature as the base B. It is therefore necessary to provide a very narrow base in order to reduce the base-collector surface area and the capacitance $C_{BC}$.

SUMMARY OF THE INVENTION

The aim of the present invention is to resolve the drawbacks of the prior art.

To this end, the invention proposes a novel method for producing a metallic air bridge without width constraints and independent of the crystallographic direction of the substrate.

The object of the present invention is more particularly a method of manufacturing a double heterojunction bipolar transistor comprising successively at least one sub-collector layer, a collector layer, a base layer and a metallic layer deposited on the said base layer; the said metallic layer being extended towards a contact pad of the base by an underetched metallic "air bridge", characterised in that producing the said "air bridge" includes the following steps:
  effecting a first localised etching under said bridge, this first etching being selective so as to etch the sub-collector layer laterally; and
  effecting a second localised etching under the said bridge, this second etching being selective so as to vertically etch at least the collector layer.

According to one characteristic, the sub-collector layer is gallium indium arsenide (GaInAs).

According to one characteristic, the collector layer is indium phosphide (InP).

According to a preferential embodiment, the transistor also has a second sub-collector layer of indium phosphide, this second sub-collector layer being etched vertically during the second selective etching.

According to one characteristic, the transistor is produced on a semi-insulating indium phosphide substrate, the substrate being partly etched vertically during the second selective etching.

According to one variant embodiment, the metallic "air bridge" is oriented perpendicularly to a crystallographic direction favourable to the InP etching, one edge of the metallic region, one edge of the contact pad and one end of the metallic "air bridge" being aligned.

The present invention relates to a double heterojunction bipolar transistor having InP in the collector and a metallic region deposited on the base layer, the said metallic region extending towards a contact pad through an underetched metallic "air bridge", characterised in that the said "air bridge" is oriented in a crystallographic direction unfavourable to the etching of the InP.

The present invention also concerns a component having a metallic region deposited on epitaxial layers on a semi-insulating substrate made of III-V material, the said metallic region extending towards a contact pad through an underetched metallic "air bridge", characterised in that the component has at least one layer of InP deposited directly on the semi-insulating substrate, the said layer being etched under the metallic "air bridge".

The method according to the invention has the advantage of being completely compatible with the conventional methods of manufacturing heterojunction bipolar transistors. Only the pattern of the metal of the base is modified compared with a conventional transistor.

In addition, the method according to the invention makes it possible to effect the insulation of the air bridge along any crystallographic orientation.

In addition, the capacitance $C_{BC}$ of the transistor according to the invention has been able to be halved compared with a conventional transistor, for an emitter surface area of $2 \times 1.2 \ \mu m^2$; and, for the same performance level, the consumption of the transistor according to the invention has been divided by twelve.

BRIEF DESCRIPTION OF THE DRAWINGS

Other characteristics and advantages of the invention will emerge clearly from a reading of the following description, given as an indication and non-limitatively, and with regard to the figures, in which:

FIG. 2b, already described, is a view in transverse section along AA' in FIG. 2a;

FIG. 2c, already described, is a view in longitudinal section along DD' in FIG. 2a;

FIGS. 7a to 7d illustrate schematically the steps of the method of manufacturing the transistor according to the present invention;

FIG. 8 is a graph illustrating the operating frequency of a transistor according to the current injected into the collector of the transistor according to the invention;

FIG. 9 is a comparative graph illustrating the operating frequency according to the current injected into the collector between transistors of the state of the art and transistors according to the invention for different emitter surface areas.

DETAILED DESCRIPTION OF THE INVENTION

The present invention proposes a novel method for producing the metallic "air bridge" which extends the metallic layer of the base of the transistor towards a completely isolated contact pad of the transistor. This method advantageously associates the particularities of the semiconductor layers which constitute the structure of a double heterojunction bipolar transistor (DHBT).

Figure 1:
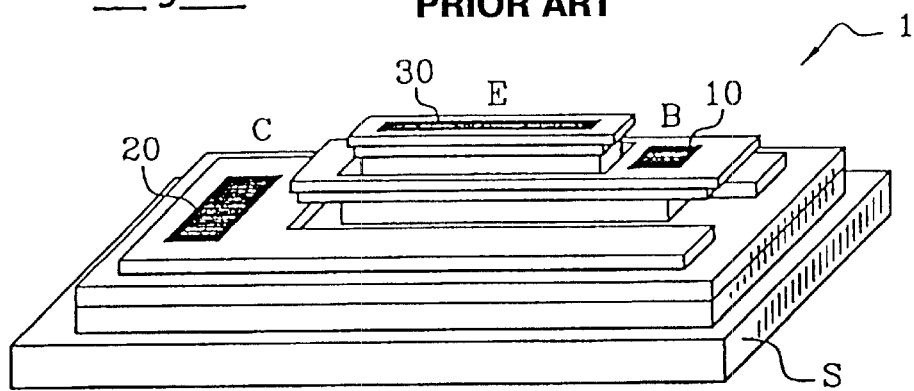
FIG. 1, already described, depicts a schematic perspective view of a conventional heterojunction bipolar transistor.
Figure 2A:
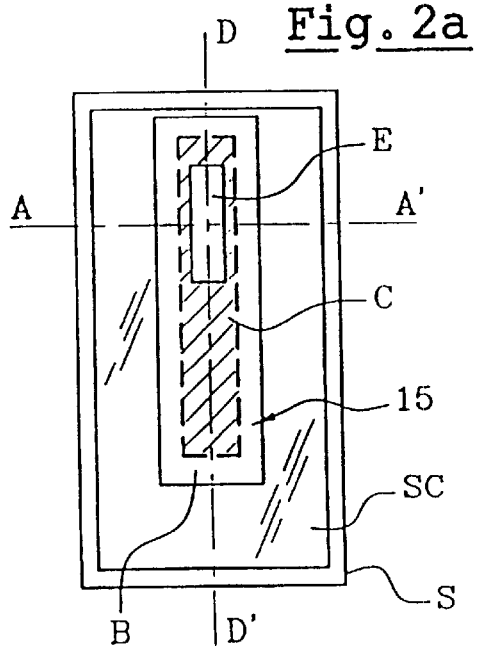
FIG. 2a, already described, is a schematic plan view of a heterojunction bipolar transistor produced in accordance with a known method of the prior art.
Figure 2B:
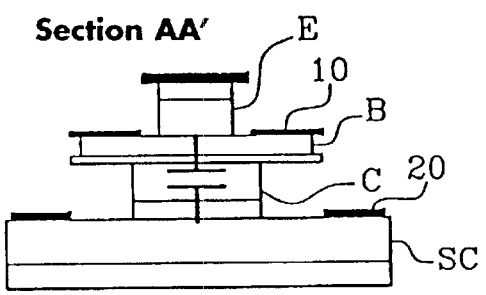
Figure 2C:
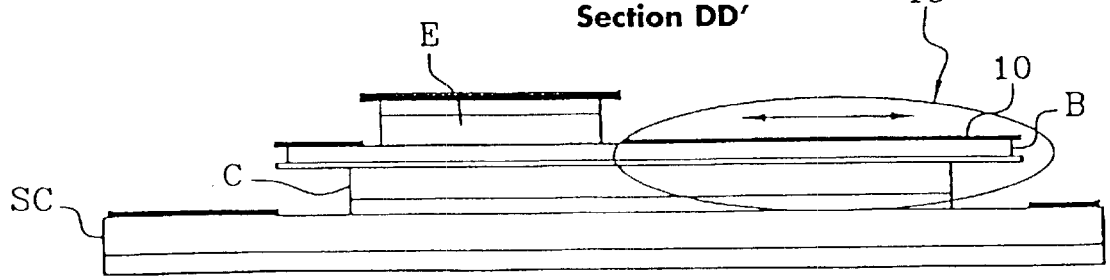
Figure 3:
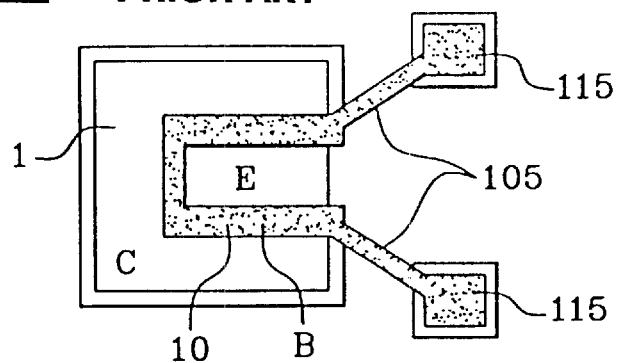
FIG. 3, already described, is a schematic view of a heterojunction bipolar transistor produced according to another known method of the state of the art.
Figure 4:
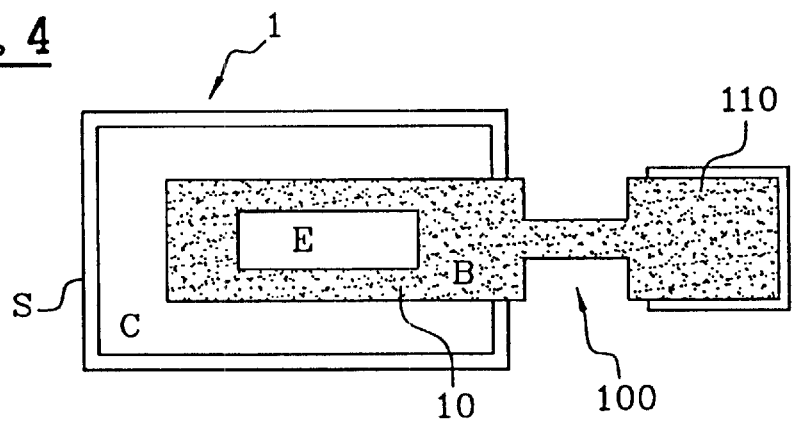
FIG. 4 is a schematic plan view of a heterojunction bipolar transistor according to the present invention.

As illustrated in FIG. 4, the method according to the invention makes it possible to produce the metallic "air bridge" 100 along any crystallographic orientation and aligned with the transistor 1. This represents an advantage compared with the known NTT method in terms of bulk and freedom of implantation on the semiconductor wafer.

Figure 5:
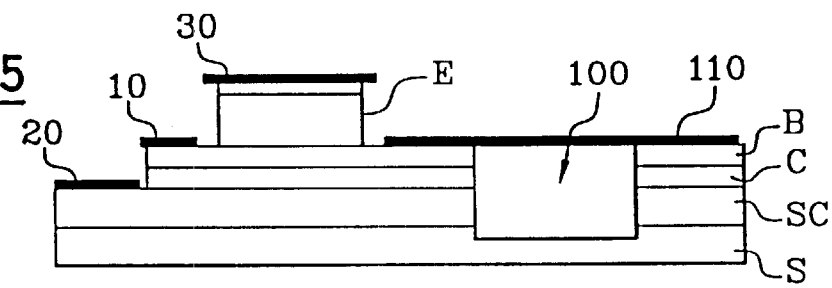
FIG. 5 is a view in longitudinal section of FIG. 4.

FIG. 5 is a schematic view in longitudinal section of the transistor according to the invention. It can easily be seen that the base-collector common surface is reduced to its minimum without impairing the surface area necessary for the contact on the base 10, which is extended towards the pad 110.

Figure 6:
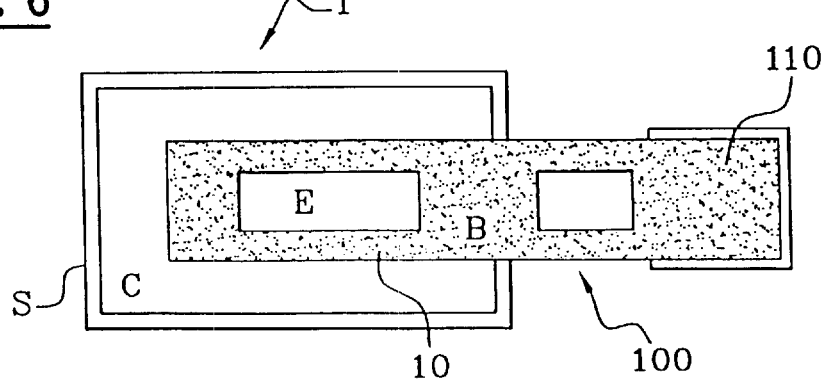
FIG. 6 is a schematic plan view of a transistor according to a variant embodiment of the present invention.

FIG. 6 illustrates a variant embodiment of the metallic "air bridge" 100. This variant uses a particular pattern of the "air bridge" 100 in which it has been sought to eliminate the corners unfavourable to the lateral etching of the InP. In particular, the underetching of the InP is blocked in directions [01-1] and [011].

According to this particular embodiment, the "air bridge" 100 is oriented perpendicularly to a crystallographic direction favourable to the lateral etching of the InP, namely the direction [001] or [010], and the edges of the metallic region 10, of the "air bridge" 100 and of the contact pad 110 are aligned.

FIGS. 7a to 7d illustrate schematically the main steps of the method of producing the transistor according to the invention, and more specifically the steps of isolating the "air bridge". These figures describe the method in the case of a double heterojunction bipolar transistor.

The schematic structure of a double heterojunction transistor consists of an InP emitter layer deposited on a base layer B made of InGaAs in order to form a first heterojunction. The second heterojunction is situated between the InGaAs base B and the InP collector C.

The collector layer can advantageously be deposited on at least one sub-collector layer SC produced from a different material and doped with the same type. Thus, in the example in FIG. 7a, the InP collector C is deposited on a first InGaAs sub-collector layer SC, deposited on a second InP sub-collector layer SC' itself deposited on the semi-insulating InP substrate S of the transistor. The contact 20 is produced on the first InGaAs sub-layer SC, which is very conductive and makes it possible to collect the charges. The second InP sub-layer SC' has a heat dissipation greater than that of InGaAs and makes it possible to dissipate the heat of the transistor in the substrate S in order to limit the risks of overheating.

FIGS. 7a to 7d are detailed views of the underetching of the metallic bridge 100, and the portion of the transistor 1 including the emitter does not therefore appear.

The method according to the invention consists firstly in depositing a layer of metal 10 on the base layer B, this layer 10 being deposited in a particular pattern in the form of a rail 100, which is extended towards a contact pad 110.

A first etching illustrated in FIG. 7b consists in laterally etching the InP collector layer C over its entire width, as described with reference to the prior art, in order to reduce the base-collector common surface and thereby the capacitance $C_{BC}$. This step is possible only in a certain crystallographic orientation of the transistor on the wafer, as previously described.

The method according to the invention consists in etching the collector C and sub-collector SC layers under the bridge 100 in order to isolate the transistor 1 from the contact pad 110 on the base B. According to an essential characteristic of the invention, the method of underetching the bridge 100 is effected in two steps. The transistor 1 and the contact pad 110 are protected by a photosensitive resin, leaving the bridge 100 uncovered.

The first step, illustrated in FIG. 7c, consists in effecting a first localised etching I under the bridge 100, this first etching being selective so as to laterally etch the sub-collector layer SC composed of InGaAs. The lateral etching of the InGaAs is in fact possible in any crystallographic direction. It can simply be more or less rapid according to this orientation. A difference in speed of approximately 30% has been measured between a favourable direction and an unfavourable direction, which remains acceptable.

This first etching clears a vertical access to the collector layer C and to the second sub-collector layer SC' made of InP.

Thus the second step, illustrated in FIG. 7d, consists of effecting a second localised etching II under the bridge 100, this second etching being selective so as to vertically etch the collector C and sub-collector SC' layers composed of InP. The vertical etching also makes it possible to partially reach the semi-insulating substrate S made of InP, and thus to electrically isolate the bottom of the contact pad 110 with respect to the transistor 1. The etching of the substrate S is light, around 0.1 μm approximately for a substrate approximately 300 μm thick.

The vertical etching of the InP allows an underetching of the bridge 100 which is rapid and independent of the crystallographic orientation.

This second vertical etching II must however not be extended in order not to accentuate the lateral etching of the collector C if this takes place and thus introduce a risk of obtaining a width of collector less than that of the emitter, which would cause the performance of the transistor to drop. In all cases, vertical etching is always more rapid than lateral etching when it is possible, notably because the thickness of the layers to be etched is less than their width.

The method according to the invention has been implemented on different wafers and has made it possible to obtain small transistors with good operating frequencies whilst appreciably reducing the current consumption. FIG. 8 is a graph illustrating such performance.

A transistor having an emitter surface Se of 2*1.2 μm with a metallic air bridge according to the invention can achieve an operating frequency of 150 GHz at 2 mA with a peak at 172 GHz at 4 mA.

It will be noted that, for the same performance level, the consumption of the transistor according to the invention has been able to be divided by twelve, which reduces its heat dissipation accordingly.

FIG. 9 is a comparative graph which highlights the importance of the method according to the invention for small transistors.

It will be noted that, for a transistor having a large emitter surface Se of 3*10 μm², transferring the contact area of the base to a pad remote from the transistor scarcely modifies the performance in terms of frequency and consumption.

On the other hand, for a small transistor with a transmitter surface area of 3*3 μm², the operating frequency is appreciably higher for a transistor produced according to the method of the present invention than for a conventional transistor.

What is claimed is:

1. A method of manufacturing a double heterojunction bipolar transistor comprising successively at least one sub-collector layer, a collector layer, a base layer and a metallic layer deposited on the said base layer, said metallic layer being extended towards a contact pad of the base by an underetched metallic "air bridge", wherein producing said "air bridge" includes the following steps:

effecting a first localized etching under said bridge, this first etching being selective so as to etch the sub-collector layer laterally; and effecting a second localised etching under the said bridge, this second etching being selective so as to vertically etch at least the collector layer.

2. A method according to claim 1, characterized in that the sub-collector layer is gallium indium arsenide (GaInAs).

3. A double heterojunction bipolar transistor manufactured according to the method of claim 2.

4. A method according to claim 1, characterized in that the collector layer is indium phosphide (InP).

5. A double hetrojunction bipolar transistor manufactured according to the method of claim 4.

6. A method according to claim 1, characterized in that the transistor also has a second sub-collector layer made of phosphide (InP), this second sub-collector layer being etched vertically during the second selective etching.

7. A method according to claim 1, characterized in that the transistor is produced on a semi-insulating substrate made of indium phosphide (InP), the substrate being partly etched vertically the second selective etching.

8. A method according to claim 1, characterized in that the metallic "air bridge" is oriented perpendicularly to a crystallographic direction favorable to the etching of the InP, and in that one edge of the metallic region, one edge of the contact pad and one edge of the metallic "air bridge" are aligned.

9. A double heterojunction bipolar transistor manufactured according to the method of claim 8.

10. A component obtained according to claim 1, having InP in the collector and a metallic region deposited on the base layer, said metallic region extending towards a contact pad through an underetched metallic "air bridge", characterized in that said "air bridge" is oriented in a crystallographic direction unfavorable to the etching of the InP.

11. A component obtained according to claim 1, having a metallic region deposited on epitaxial layers on a semi-insulating substrate made of III-V material, said metallic region extending towards a contact pad through an underetched metallic "air bridge", characterized in that the component has at least one layer of InP deposited directly on the semi-insulting substrate, said layer being etched under the metallic "air bridge".

12. A double heterojunction bipolar transistor comprising successively at least one sub-collector layer, a collector layer, a base layer and a metallic layer deposited on the said base layer, said metallic layer being extended towards a contact pad of the base by an underetched metallic "air bridge", wherein said transistor includes InP in the collector layer and in the metallic region deposited on the base layer, and wherein said "air bubble" is oriented in a crystallographic direction unfavorable to the etching of the InP.

13. A double heterojunction bipolar transistor comprising successively at least one sub-collector layer, a collector layer, a base layer and a metallic layer deposited on the said base layer, said metallic layer being extended towards a contact pad of the base by an underetched metallic "air bridge", wherein said metallic region is deposited on epitaxial layers on a semi-insulating substrate made of III-V material, and wherein the transistor has at least one layer of InP deposited directly on the semi-insulating substrate, the said layer of InP being etched under the metallic "air bridge".

* * * * *